(12) United States Patent
Furno et al.

(10) Patent No.: US 8,527,837 B2
(45) Date of Patent: Sep. 3, 2013

(54) SELECTIVE ERROR CONTROL CODING IN MEMORY DEVICES

(75) Inventors: Antonio Furno, Benevento (IT); Luca Porzio, Casalnuovo (IT); Antonio Iorio, Casalnuovo (IT)

(73) Assignee: Micron Technology, Inc., Boise, ID (US)

( * ) Notice: Subject to any disclaimer, the term of this patent is extended or adjusted under 35 U.S.C. 154(b) by 363 days.

(21) Appl. No.: 12/905,238

(22) Filed: Oct. 15, 2010

(65) Prior Publication Data

US 2012/0096332 A1 Apr. 19, 2012

(51) Int. Cl.
*G11C 29/00* (2006.01)

(52) U.S. Cl.
USPC ........................................... 714/763; 714/773

(58) Field of Classification Search
USPC .................................................. 714/763, 773
See application file for complete search history.

(56) References Cited

U.S. PATENT DOCUMENTS

| 6,295,619 | B1 * | 9/2001 | Hasbun et al. ................ 714/719 |
| 8,239,729 | B2 * | 8/2012 | Borchers et al. .............. 714/758 |
| 2008/0022184 | A1 * | 1/2008 | Jeong et al. .................... 714/758 |
| 2009/0164704 | A1 * | 6/2009 | Kanade et al. ................ 711/103 |

* cited by examiner

*Primary Examiner* — Philip Guyton
(74) *Attorney, Agent, or Firm* — Dorsey & Whitney LLP (57) ABSTRACT

A method includes determining that a received data stream includes metadata and content, applying error control coding to the received metadata, disabling error control coding for the received content, and storing the metadata, the error control coding, and the content in a memory device.

23 Claims, 8 Drawing Sheets

SELECTIVE ERROR CONTROL CODING IN MEMORY DEVICES

FIELD

The present invention relates generally to memory devices and software, and more specifically to data storage, file systems, and retrieval in nonvolatile memory.

BACKGROUND

Many data storage and retrieval systems employ some level of error control coding so that errors introduced during the storage and retrieval processes can be corrected. In general, more complex error control codes can detect and correct a greater number of errors in a data word than can be detected and corrected using simpler error control codes. However, implementing complex error control codes increases the hardware and/or software resources necessary to encode and decode the data. Thus, memory system design often involves making trade-offs between system complexity and error detection and correction capability.

BRIEF DESCRIPTION OF THE DRAWINGS

Embodiments of the invention are illustrated by way of example and not limitation in the figures of the accompanying drawings, in which.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification, discussions utilizing terms such as "processor," "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "processor" may be embodied by equipment and devices that make up one or more central processing units of a computer. A "processor" may also be embodied by software running on a computer that executes algorithms, methods, procedures, functions, and so forth to achieve a desired outcome.

Embodiments of the present invention may include apparatuses for performing the operations herein. An apparatus may be specially constructed for the desired purposes, or the apparatus may comprise a general purpose computing device selectively activated or reconfigured by a computer program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), non-volatile memories such as electrically programmable read-only memories (EPROMs), electrically erasable and programmable read only memories (EEPROMs), phase change memories (PCM) or FLASH memories, or any other type of media suitable for storing electronic instructions, and capable of being coupled to a system bus for a computing device.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g. as in a cause an effect relationship).

Figure 1:
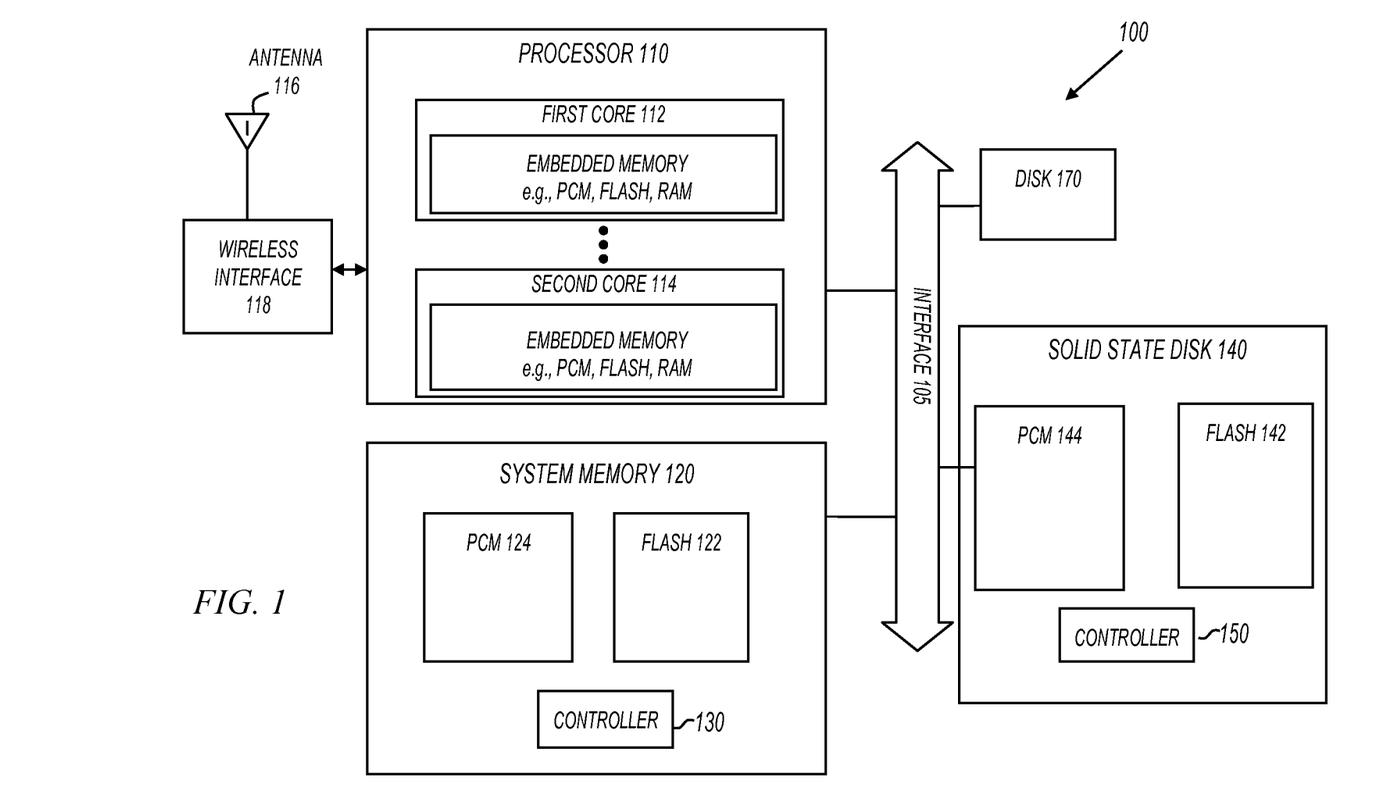
FIG. 1 shows an electronic system in accordance with various embodiments of the invention.

FIG. 1 shows a system 100 in accordance with various embodiments of the present invention. System 100 may be any type of device that includes memory without departing from the scope of the present invention. For example, system 100 may be a computer or a mobile phone with nonvolatile memory. Also for example, system 100 may be a global positioning system (GPS) receiver or a portable media player with nonvolatile memory. In another example, system 100 represents a "set top box" that records content in a manner similar to a digital video recorder. As will be described later herein, one or more of system memory 120 and solid-state disk 140 may partition one or more of phase change memory (PCM) 124 and 144, and/or FLASH 122 and 142 to operate as a circular buffer that stores recorded, or "time-shifted", content for later viewing by the user.

In some embodiments of the invention, perhaps only a few seconds of content can be recorded for later viewing. In other embodiments of the invention, system memory 120 and/or solid-state disk 140 may be capable of storing many hours of audio, video, and multimedia content for later viewing by a user. In an embodiment of the invention, system 100 implements a time shift application in which a circular buffer within one or more of system memory 120 and solid-state disk 140 simultaneously or nearly simultaneously writes content to memory and reads content from the memory. This allows the user to view content that has been time shifted perhaps by as little as a few seconds or as much as several hours or more. In an embodiment of the invention, selective error control coding is used to provide error correction and detection for metadata stored in one or more of system memory 120 and/or solid-state disk 140. In this embodiment, error control coding is not applied to content, which may include audio, video, multimedia, text, and so forth.

In time shifting applications in which a circular buffer is used, SSD 140 and/or system memory 120 may partition one or more of PCM 124 and 144, as well as FLASH 122 and 142. In one partition, a standard file structure is used to write data to memory and to read data from memory. In this example, a second partition appears as a circular buffer in which at least one of memory controllers 130 and 150 writes content to a "head" location within the circular buffer for later playback. When playback is desired, the stored content is read from a "tail" location within the circular buffer. In this embodiment, one or more of controllers 130 and 150 may be simultaneously or nearly simultaneously reading content and metadata from memory while writing content and metadata to the memory.

In the embodiment of FIG. 1, system 100 includes a wireless interface 118 coupled to antenna 116 to allow system 100 to communicate with other devices that communicate over-the-air. As such, system 100 may operate as a cellular device or a device that operates in wireless networks such as, for example, Wireless Local Area Networks (WLANs), WiMax and Mobile WiMax based systems, Wideband Code Division Multiple Access (WCDMA), and Global System for Mobile Communications (GSM) networks, any of which may or may not operate in accordance with one or more standards. The various embodiments of the invention are not limited to operate in the above-identified network types; this is simply a list of examples. It should be understood that the scope of the present invention is not limited by the types of, the number of, or the frequency of the communication protocols that may be used by system 100. Embodiments are not, however, limited to wireless communication embodiments. Other non-wireless applications can make use of the various embodiments of the invention. In one non-wireless application, FIG. 1 may represent a personal computing device (PC) or a server in which FLASH memory devices and/or PCM devices located between disk 170 and the embedded memories of first and second cores 112 and 114 enhance the performance of disk 170 and reduce the time required to start the operating system of the PC or server.

In some embodiments, wireless interface 118 may include one or more stand-alone Radio Frequency (RF) discrete or integrated analog circuits. In other embodiments, wireless interface 118 may be embedded within an integrated circuit that includes other components. For example, in some embodiments, wireless interface 118 may be included on a common integrated circuit with processor 110.

Processor 110 includes at least first core 112 and second core 114, and each core may include memory. For example, first core 112 may include volatile or nonvolatile memory, such as PCM, FLASH, RAM, and so forth. Each core may include any combination of different types of memory without departing from the scope of the present invention. Processor 110 may execute instructions from any suitable memory within system 100. For example, any memory within a processor core, or any of the memory devices within system memory 120, may be considered a computer-readable medium that has instructions stored that when accessed cause processor 110 to perform according to embodiments of the invention.

First core 112 and second core 114 may also make use of Magnetic Random Access Memory (MRAM), which employs magnetic storage elements formed from two ferromagnetic plates located at an intersection of a row and column line and selected by a Magnetic Tunnel Junction (MTJ) device. Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

First core 112 and the second core 114 may also make use of Ferro-electric Random Access Memory (FRAM), which employs memory cells that may include one transistor and one capacitor. The capacitor includes ferroelectric material and a bi-stable atom in the ferroelectric material that is shifted to form two stable polarization states. Memory cell data may be written by positively or negatively orienting the dipoles of the ferroelectric material via an applied polarizing voltage. Data may be read by detecting the voltage of the bit line (BL) connected with the memory cell. Current feed circuits supply electric currents to the bit lines for a predetermined period from a start of a read operation, and read control circuitry senses the direction of the electric polarization as either a high or a low logic state. Each orientation is stable and remains in place even after the electric field is removed, preserving the data within the memory without periodic refresh.

Processor 110 is shown coupled to interface 105. Interface 105 provides communication between processor 110 and the various other devices coupled to interface 105. For example, processor 110 may communicate with memory devices in system memory 120, solid state disk (SSD) 140, as well as disk 170. Interface 105 can include serial and/or parallel buses to share information along with control signal lines to be used to provide handshaking between processor 110 and the various other devices coupled to interface 105.

In some embodiments of the invention, system 100 may not include disk 170. For example, in some mobile phone embodiments, disk 170 may not be present. However, in other embodiments of the invention, such as computer-based applications, disk 170 may be included.

System memory 120 includes FLASH memory 122 and PCM 124. FLASH memory 122 stores information by storing charge on a floating gate in a Metal Oxide Semiconductor (MOS) transistor. The stored charge alters the threshold voltage of the transistor, and the difference in threshold voltage is "read" to determine whether the stored information is a "0" or a "1". In some embodiments, varying amounts of charge are stored on the floating gate to represent more than one bit of information per memory cell. This is sometimes referred to as Multi-Level Cell (MLC) FLASH. FLASH memory 122 may be any type of FLASH memory, including NOR FLASH memory, NAND single level cell (SLC) memory, or NAND multi-level cell (MLC) memory.

As previously mentioned, system memory 120 also includes PCM 124. A PCM is a memory that stores information based on modifiable material properties, such as whether a material is in a crystalline or an amorphous state (phase). For example, in some embodiments, phase change memories include alloys of elements of group VI of the periodic table, such as Te or Se, that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Phase change memory may be referred to as a Phase Change Memory (PCM), Phase-Change Random Access Memory (PRAM or PCRAM), Ovonic Unified Memory (OUM), Chalcogenide Random Access Memory (C-RAM), or by other suitable names.

Memory devices within system memory 120 may be packaged in any manner. For example, in some embodiments, FLASH memory 122 and PCM 124 may be combined in a stacking process to reduce the footprint on a board, packaged separately, or placed in a multi-chip package with the memory component placed on top of the processor.

Solid state disk (SSD) 140 includes FLASH memory 142, PCM 144, and controller 150. Controller 150 may be any type of controller, including a microcontroller, a microprocessor, or the like. SSD 140 emulates the operation of a hard disk. For example, in some embodiments, SSD 140 may appear to the rest of the system as a FAT (file allocation table) formatted hard drive.

In operation, SSD 140 receives read and/or write requests. The read requests are satisfied by reading contents from FLASH memory 142 and from PCM 144, and the write requests are satisfied by writing to FLASH memory 142 and to PCM 144. Although not shown in FIG. 1, a translation layer may be used within SSD 140 to map logical addresses in the read and write requests to physical addresses in FLASH memory 142 and PCM 144. In some embodiments, the logical addresses include sector numbers and the physical addresses include blocks within the FLASH memory.

Figure 2:
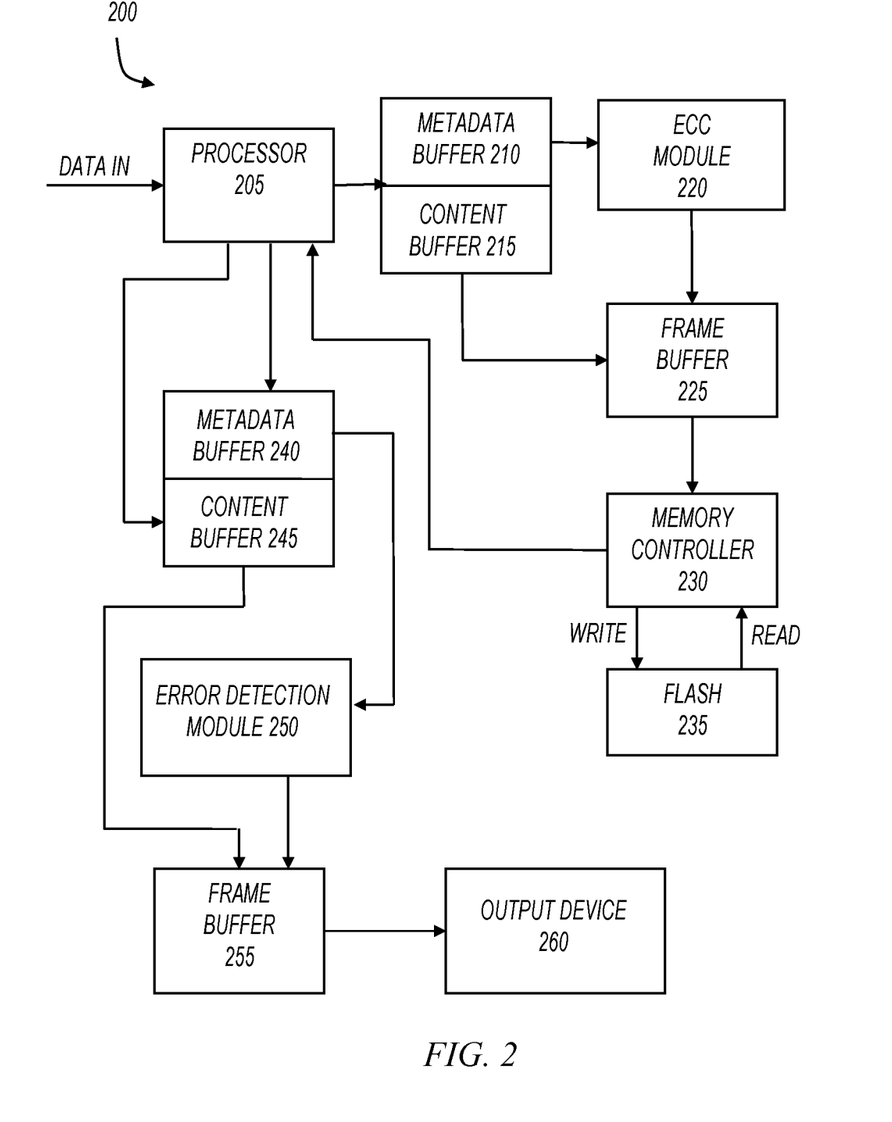
FIG. 2 shows a data storage and retrieval system in accordance with various embodiments of the invention.

FIG. 2 shows data storage and retrieval system 200 in accordance with various embodiments of the invention. System 200 may represent a portion of a set-top box that records content for replaying at a later time. In FIG. 2, data is received by processor 205. In various embodiments of the invention, this data represents content, which may include audio, video, multimedia, text, and so forth as well as metadata which may include header information, synchronization information, frame identification, and so forth. Processor 205, operating under the control of a "content-aware file system" program identifies and separates content from metadata. Metadata identified by processor 205 is stored in metadata buffer 210, while content identified by processor 205 is stored in content buffer 215.

Metadata buffer 210 is coupled with error control coding (ECC) module 220. In the embodiment of the FIG. 2, ECC module 220 applies a linear error control code, such as a Hamming code, a Bose-Chaudhuri-Hocquenghem code, or a Reed Solomon code, to the metadata conveyed from a data buffer 210. Data from content buffer 215 bypasses ECC module 220. In other embodiments of the invention, content buffer 215 may pass through ECC module 220 but ECC module 220 may disable the error control coding function, thus allowing content to pass directly to frame buffer 225.

As has been described, embodiments of the invention selectively apply error control coding to metadata and content. In these embodiments, error control coding is not applied equally to content and metadata. Any errors introduced during the storage and playback of recorded content (which may include audio, video, multimedia, text, and so forth) may be unnoticeable to the user when displayed by way of audio and/or video reproduction equipment. Accordingly, in many embodiments, error control coding is not applied to content in the same manner as the error control coding is applied to metadata. By selectively applying error control coding to metadata, the resulting system need not be burdened with additional resources needed to apply error control coding to content as well as metadata.

Returning now to FIG. 2, the error control encoded metadata along with the content (to which error control coding has not been applied) are assembled in frame buffer 225. The contents of frame buffer 225 are then conveyed to memory controller 230. Memory controller 230 then writes data blocks to a "head" location of a circular buffer within FLASH memory 235.

When a user seeks to replay content stored in FLASH memory 235, the stored data is read from a "tail" location of a circular buffer within the FLASH memory. Data from the tail location is conveyed through memory controller 230 to processor 205. Processor 205 determines that both metadata and content are present in the data received from memory controller 230. Metadata is conveyed to metadata buffer 240 while content is conveyed to content buffer 245. The metadata, accompanied by error control bits, is conveyed to error detection module 250 which may apply a linear transformation that includes at least one exclusive OR function (XOR) to the error control encoded metadata. The resulting error-corrected metadata is combined with content from content buffer 245 in frame buffer 255. In embodiments of the invention, a Hamming code, Bose-Chaudhuri-Hocquenghem code, or a Reed Solomon code is used to provide error control coding is capable of correcting at least one bit for every 512 bytes. The contents of frame buffer 255 are then conveyed to output device 260. In an embodiment of the invention, output device 260 is a multimedia entertainment center which includes audio and video reproduction capabilities. In other embodiments of the invention, output device 260 is an audio device, such as an MP3 player.

Although the embodiment of FIG. 2 includes several hardware and/or software components, embodiments of the invention may include fewer components. Thus, an embodiment of the invention may only include a processor for separating an incoming data stream into metadata and content along with an error control coding module for applying error control coding to the metadata, wherein the content bypasses the error control coding module. Further, nothing prevents many of the functional blocks of FIG. 2 from being implemented in software. Thus, as an example, ECC module 220 and error detection module 250 may be embodied using hardware elements such as exclusive OR (XOR) gates that behave according to a particular truth table. In other embodiments, this functionality may be brought about by software modules operating on or in conjunction with processor 205.

Figure 3:
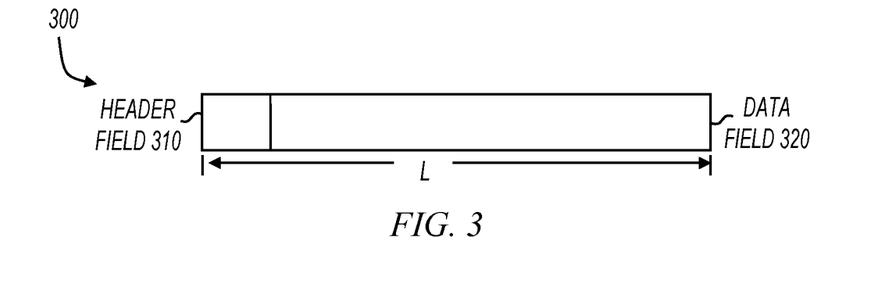
FIG. 3 shows an exemplary data packet in accordance with various embodiments of the invention.

FIG. 3 shows an exemplary transport stream packet in accordance with various embodiments of the invention. In the embodiment of FIG. 3, the length (L) of transport stream packet 300 is 188 bytes. Header field 310 is five bytes in length with data field 320 being 183 bytes in length.

Figure 4:
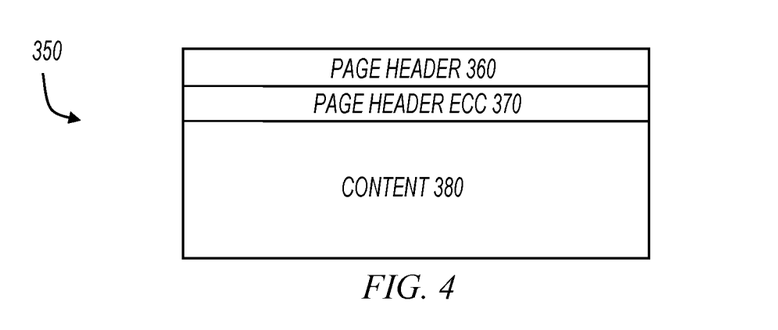
FIG. 4 shows an exemplary NAND FLASH page in accordance with various embodiments of the invention.

FIG. 4 shows an exemplary NAND FLASH page in accordance with various embodiments of the invention. In FIG. 4, NAND FLASH memory page 350 possesses a capacity 2 kB of data plus a spare area of 64 data bytes. Accordingly:

$$(2 \text{ kB}+64 \text{ bytes})/188 \text{ bytes}=11 \text{ packets per page} \quad (1)$$

Thus, in this example, 11 of transport stream packets 300 (of FIG. 3) can be accommodated by NAND FLASH page 350 of FIG. 4. In this example, page header portion 360 is 55 bytes in size (5 bytes×11 packets) with content portion 380 being 2013 bytes in size (183×11 packets). Continuing with this example, the page header error control coding (page header ECC 370) can be calculated as follows:

$$2*\log_2(\text{size of } (H) \text{ in bits})=2*\log_2(55*8)\approx 18 \text{ bits}\approx 3 \text{ bytes} \quad (2)$$

Thus, for this example, 11 transport stream packets can be stored in NAND FLASH page 350 of FIG. 4, plus an additional three bytes of error control coding information. In this example, NAND FLASH page 350 should be 2071 bytes in length according to the following:

$$2013 \text{ bytes (content)}+55 \text{ bytes (header)}+3 \text{ bytes (ECC)}=2071 \text{ bytes} \quad (3)$$

Figure 5:
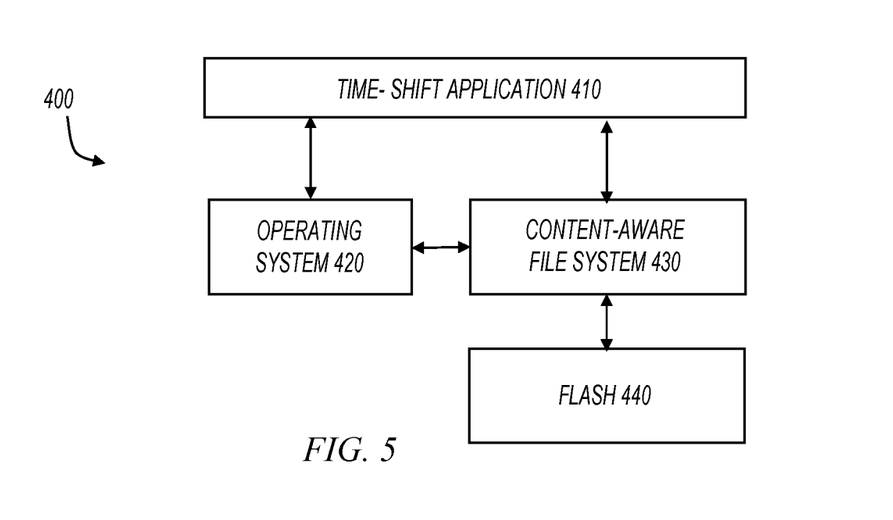
FIG. 5 shows a time shift application interfacing with an operating system and a memory device in accordance with various embodiments of the invention.

FIG. 5 (400) shows a time-shift application interfacing with an operating system and a memory device in accordance with various embodiments of the invention. In FIG. 5, time shift application 410 is called by operating system 420. At a lower level, content-aware file system 430 interfaces with FLASH memory 440 to partition the memory into a standard file system and a circular buffer.

Figure 6:
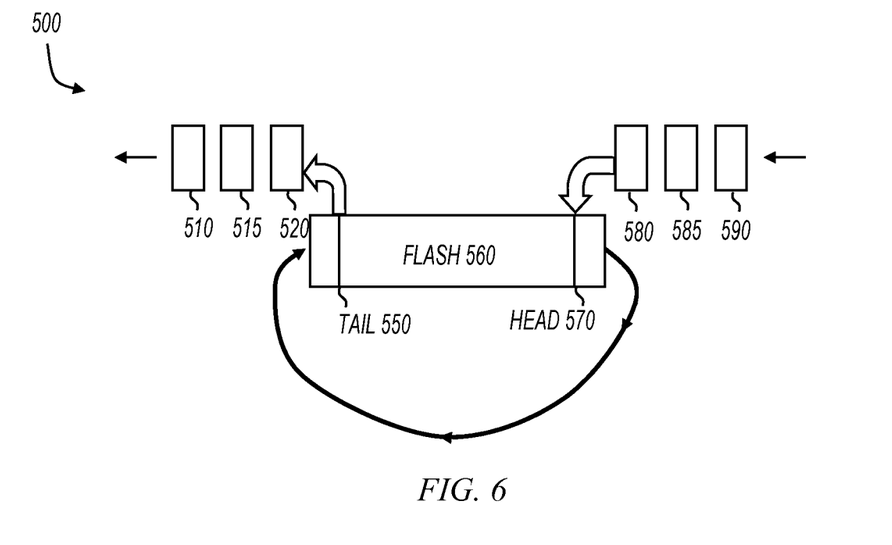
FIGS. 6-7 show circular buffers implemented in FLASH memory in accordance with various embodiments of the invention.
Figure 7:
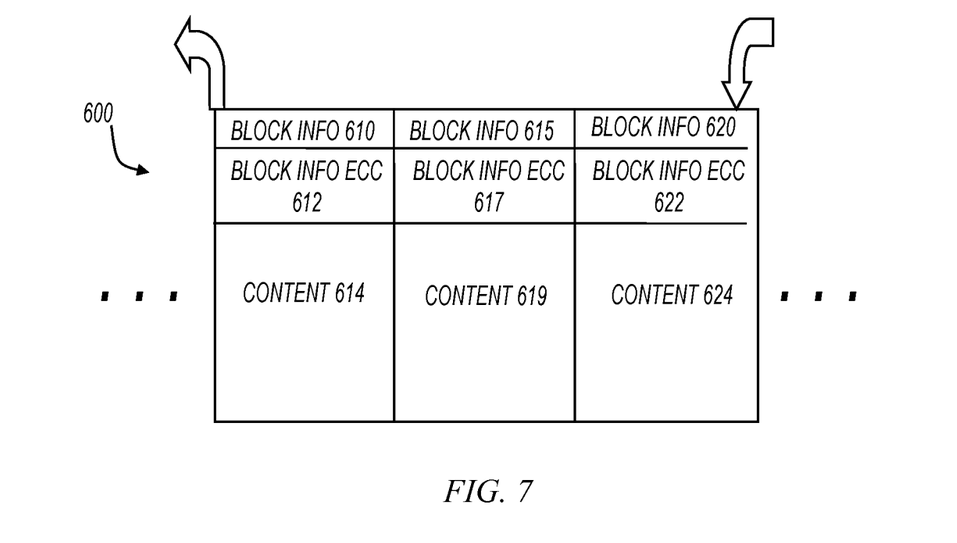

FIGS. 6-7 show circular buffers implemented in FLASH memory in accordance with various embodiments of the invention. In FIG. 6 (500), FLASH memory 560 is written to at head location 570. Data packets 580, 585, and 590 represent data in sequence to be written to locations of FLASH memory 560 in due course. At tail 550, data is read from FLASH memory 560, with data packet 510 being followed by reading data packet 515 and data packet 520. In the embodiment of FIG. 6, FLASH memory 560 has been arranged as a circular buffer in which data packet 585 is written to the right of the location of FLASH memory 560 at which data packet 580 is written. In a similar manner, data packet 590 is written to the right of the location of FLASH memory 560 at which data packet 585 is written. Subsequent data packets continue to be written to the right of data packets previously written to FLASH memory 560.

When reading data from FLASH memory 560, data packet 510 is read from a location to the left of the location from which data packet 515 is read. In a similar manner, data packet 515 is read from a location to the left of the location from which data packet 520 is read. Accordingly, as data packets are written to and read from FLASH memory 560, tail 550 and head 570 move from the left to the right in a clockwise direction. Further, as FLASH memory 560 is of a finite capacity, it is possible that as head 570 continues to move clockwise, head 570 may coincide with a previous location of tail 550 before packets can be read from tail 550. In this instance, transport stream packets may overwrite previously-written packets before those packets can be read at tail 550.

Although head 570 and tail 550 are shown as being separated by a portion of FLASH memory 560 that may accommodate several intervening packets (and perhaps pages), in many embodiments of the invention, tail 550 and head 570 may be adjacent to each other. By positioning tail 550 adjacent to head 570, the pages of FLASH memory 560 can be ready for playback to the user immediately after writing the page using head 570.

FIG. 7 shows a circular buffer implemented in FLASH memory 600 in accordance with various embodiments of the invention. In FIG. 7, data is read starting at the left side of the Figure, while data is written at the right side of the Figure. Beginning at the left side of the Figure, block information field 610 may represent metadata such as the block identification number, the last block written, or perhaps the last block erased. In a similar manner, block information field 615 and 620 may also represent the block identification number, the last block written, or perhaps the last block erased (but pertaining to subsequent blocks). Block information error control coding fields 612, 617, and 622 represent the error control coding (such as a Hamming code, a Bose-Chaudhuri-Hocquenghem code, or a Reed Solomon code) which can be used to correct perhaps one or more errors for every 512 bytes of information. As is the case for FIG. 6, FIG. 7 represents a circular buffer from which data is read from the left-hand side (tail 550 of FIG. 6) while data is written at the right-hand side (head 570 of FIG. 6).

Figure 8:
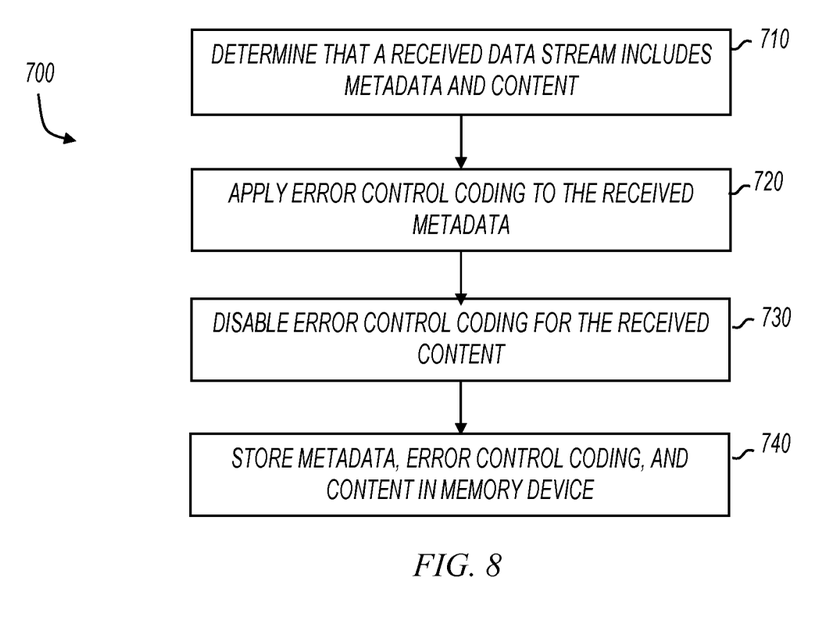
FIG. 8 shows a flow diagram for storing metadata and content in accordance with various embodiments of the invention.

FIG. 8 shows flow diagram 700 for storing metadata and content in accordance with various embodiments of the invention. At 710, a determination is made that a received data stream (perhaps from a set top box or other content recording system) includes both metadata and content. Processor 205 of FIG. 2 may perform this determination; however nothing prevents other hardware and/or software resources from being used to perform 710. The method continues at 720 in which error control coding is applied to the received metadata. In one embodiment of the invention, a Hamming code, Bose-Chaudhuri-Hocquenghem code, or a Reed Solomon code capable of correcting one bit for every 512 bytes of data is used.

The method continues at 730 in which error control coding for the received content is disabled. As mentioned previously herein, error control coding need not be applied equally to metadata and content. In many instances, in the event that errors are introduced in audio, video, multimedia, text, or other forms of content, these errors are likely to go unnoticed by many users when the content is replayed using audio and video reproduction equipment. The method continues at 740, in which metadata, error control coding for the metadata, and content (without error control coding applied) is stored in a memory device.

Figure 9:
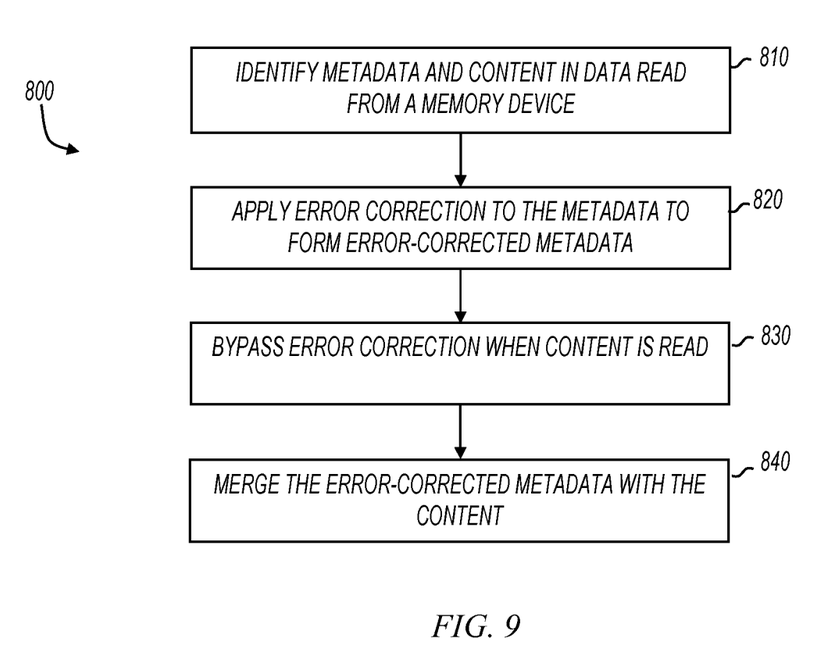
FIG. 9 shows a flow diagram for reading metadata and content from a memory device in accordance with various embodiments of the invention.

FIG. 9 shows flow diagram 800 for reading metadata and content from a memory device in accordance with various embodiments of the invention. At 810, data read from a memory device is examined to identify metadata and content. At 820, error correction is applied to the metadata to form error-corrected metadata. At 830, error correction algorithms are bypassed when content is read from the memory device. At 840, error-corrected metadata and content are merged for display to a user.

Figure 10:
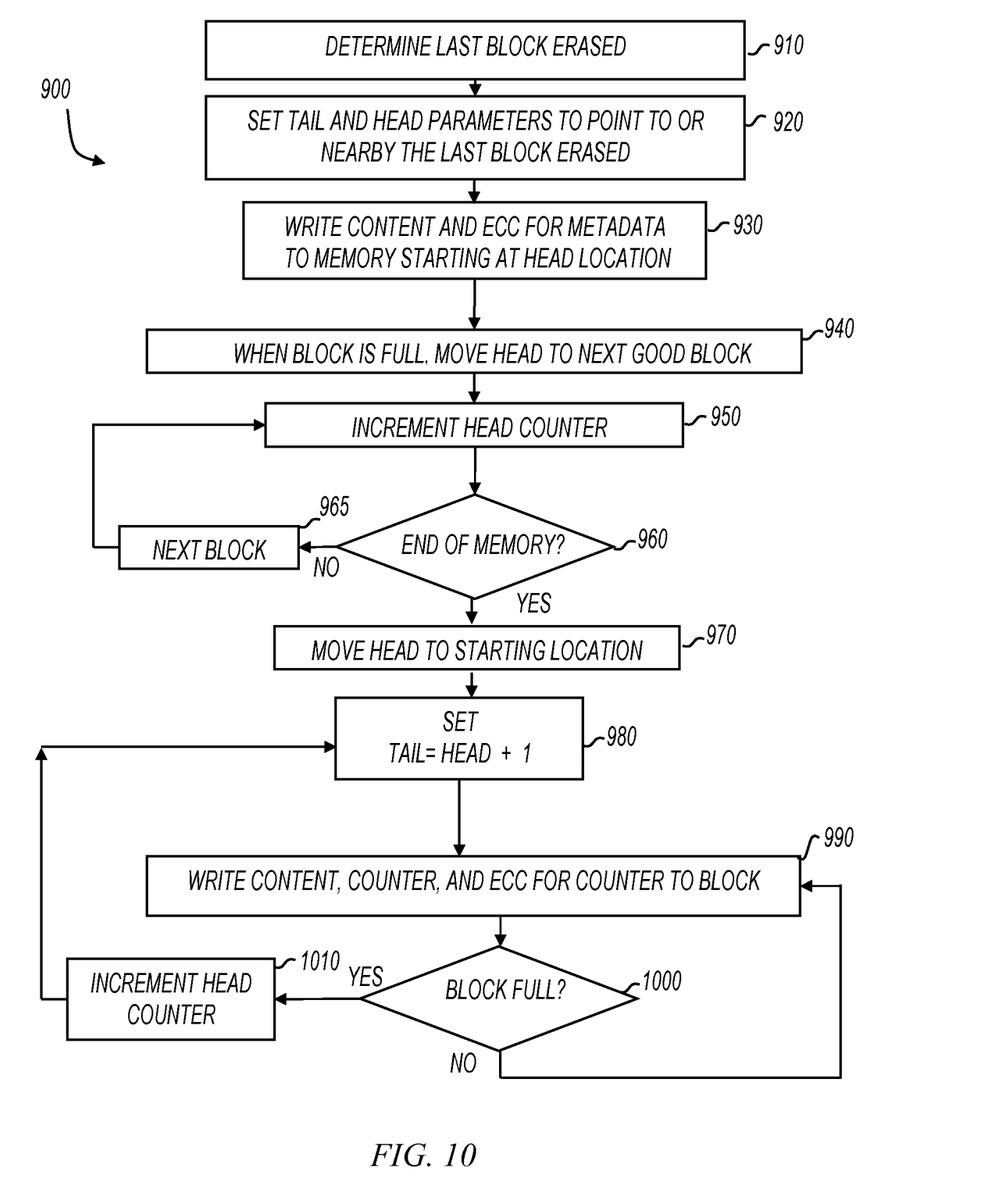
FIG. 10 shows a flow diagram for implementing a circular memory buffer in accordance with various embodiments of the invention.

FIG. 10 shows flow diagram 900 for implementing a circular memory buffer in accordance with various embodiments of the invention. At 910, a determination is made as to the last block erased. In this example, a counter may be used to identify the last block erased and the counter stored in a spare memory area. In embodiments of the invention, determining the last block erased can be useful for wear leveling in FLASH memory devices. By determining the last block erased, data can begin to be stored at a next available address as opposed to returning to a starting address (such as 0000). In the event of power interruptions, rewriting memory beginning at an address of 0000 may cause these addresses to be overwritten repeatedly, thus causing uneven wear at this address and at adjacent addresses.

In the embodiment of FIG. 10, the last block erased determined in 910 represents perhaps the only metadata being stored. Accordingly, in the example of FIG. 10, header information, synchronization information, and other metadata, as was stored in embodiments previously described herein, are not stored. The method of FIG. 10 continues at 920 in which the tail and head parameters are set to point at or nearby the location of the last block erased. Thus, as mentioned in the description of FIG. 6, the head location to which data is written and the tail location from which data is read may be positioned immediately adjacent to each other. This allows data to be read from the tail location immediately after the data has been written to the head location.

At 930, content is written to memory starting at the head location determined at 920. Any error control coding for metadata (such as last block erased) are written to a spare memory area at 930. The method continues at 940 in which the head location is moved to the next good block when the current block is full. In the embodiment of FIG. 10, the next valid block is determined by a Content-Aware File System (such as described in reference to FIG. 5) which checks a spare area of the first page of one or more of the next blocks of the memory. In the event that one or more blocks are identified as a bad block, the head location is moved to the next good block. At 950 the head counter is incremented and the head is set to the address of the next block to be written.

At 960, a determination is made as to whether the head has written blocks to an entire memory partition or perhaps to the entire FLASH memory device. If the end of the allocated memory has not been reached, 965 is performed in which the writing head moves to the next block and the head counter is incremented, as in 950.

In the event that the end of the allocated memory has been reached, 970 is performed in which the writing head is relocated back to a starting location. In some embodiments of the invention, 970 may include moving the head to location 0000 or may include moving the head location to the location determined in 920. At 980, the tail (which conducts read operations) is set adjacent to the head (for example, Tail location=Head location+1). At 990, content, block counter information, and error control coding for the counter information are written to memory. At 1000, a decision is made as to whether or not the current block is full. In the event that the current block is full, 1010 is performed in which the head counter is incremented and control returns to 980 in which the tail counter is also incremented (Tail=Head+1).

Embodiments of FIG. 10 can be considered a two-part operation in which 910-960 function to fill an allocated amount of memory. Beginning at 970 and continuing through 1010, the allocated memory functions as a circular buffer in which content, metadata, and error control coding for the metadata are written to a set of memory locations. As mentioned previously herein, the circular buffer may accommodate the storage of perhaps a few seconds of content, or may be capable of accommodating many hours of recorded content.

Figure 11:
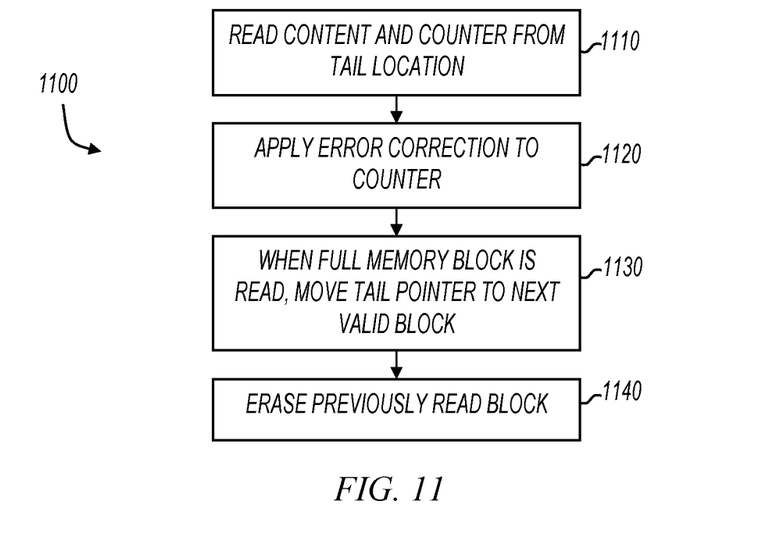
FIG. 11 shows a flow diagram for reading from a circular buffer in accordance with various embodiments of the invention.

FIG. 11 shows flow diagram 1100 for reading from a circular buffer in accordance with various embodiments of the invention. At 1110, content as well as counter information are read from a tail location. In the embodiment of FIG. 11, error control coding, such as a Hamming code, Bose-Chaudhuri-Hocquenghem code, or a Reed Solomon code capable of correcting at least one error for every 512 bytes of data, is applied to the counter information. At 1120, the error control encoded counter information is decoded. At 1130, which occurs when a full memory block is read, the tail is moved to the next memory locations so that the next valid block can be read. At 1140, the previously read block is erased. This allows a writing head to store newly acquired content at the location of the previously erased block.

Figure 12:
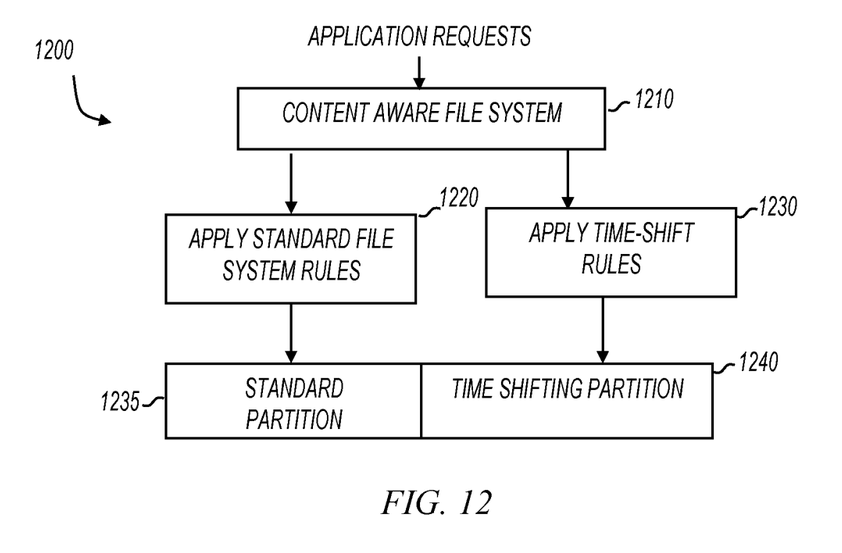
FIG. 12 shows a content-aware file system partitioning a memory device in accordance with various embodiments of the invention.

FIG. 12 shows a content-aware file system partitioning a memory device in accordance with various embodiments of the invention (1200). In FIG. 12, application requests are conveyed to a content-aware file system. For general-purpose files, standard file system rules are applied. These files may be stored in a standard partition, such as partition 1235. In the event that content is detected, time to shift rules are applied at 1230 and a time shifting partition is created on a memory device.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A method comprising: determining that a received data stream includes metadata and content; applying error control coding to the received metadata; disabling error control coding for the received content; and storing the metadata, the error control coding, and the content in a memory device.

2. The method of claim 1, wherein the content includes video information.

3. The method of claim 1, wherein the content includes audio information.

4. The method of claim 1, wherein the content includes multimedia information.

5. The method of claim 1, wherein the error control coding is one of the group consisting of: a Hamming code, a Bose-Chaudhuri-Hocquenghem (BCH) code, and a Reed-Solomon code.

6. The method of claim 1, wherein the memory device is a NAND FLASH device.

7. The method of claim 1, wherein the metadata includes at least one of the group consisting of: header, synchronization information, last block erased, and last block written.

8. The method of claim 1, additionally comprising partitioning the memory device to create at least one circular buffer.

9. The method of claim 8, wherein the storing includes storing the metadata and the received content in the at least one circular buffer.

10. A method comprising: identifying metadata and content in data read from a memory device; applying error correction to the metadata to form error-corrected metadata;

bypassing the error correction when content is read; and merging the error-corrected metadata with the content.

11. The method of claim 10, wherein the content includes audio.

12. The method of claim 10, wherein the memory device includes a circular buffer that stores time-shifted programming.

13. The method of claim 10, wherein the error correction applied to the metadata is selected from the group consisting of a Hamming code, a Bose-Chaudhuri-Hocquenghem (BCH) code, and a Reed-Solomon code.

14. The method of claim 13, wherein a Hamming code capable of correcting at least one bit for every 512 bytes is applied.

15. An apparatus comprising:
   a non-transitory processor for separating an incoming data stream into metadata and content; and
   an error control coding module for applying error control coding to the metadata, wherein the content bypasses the error control coding module.

16. The apparatus of claim 15, wherein the error control coding module implements one of the group consisting of: a Hamming code, a Bose-Chaudhuri-Hocquenghem (BCH) code, and a Reed-Solomon code.

17. The apparatus of claim 15, wherein the error control coding module implements a Hamming code.

18. The apparatus of claim 15, further comprising NAND FLASH memory for storage of the content, the metadata, and the error control coding applied to the metadata.

19. The apparatus of claim 15, wherein the content represents audio information.

20. The apparatus of claim 15, wherein the processor performs an application that creates a circular buffer in a memory and wherein the content is time shifted and stored in the circular buffer.

21. A computer-readable medium having instructions stored thereon that when accessed result in a computer performing: determining that a received data stream includes metadata and content; applying error control coding to the received metadata; disabling error control coding for the received content; and storing the metadata, the error control coding, and the content in a memory device.

22. The computer-readable medium of claim 21, wherein the content includes video information.

23. The computer-readable medium of claim 21, wherein the content includes audio information.

* * * * *